(12) United States Patent
Arsovski et al.

(10) Patent No.: US 9,886,998 B2
(45) Date of Patent: Feb. 6, 2018

(54) SELF PRE-CHARGING MEMORY CIRCUITS

(71) Applicant: GLOBALFOUNDRIES INC., Grand Cayman (KY)

(72) Inventors: Igor Arsovski, Williston, VT (US); Qing Li, Shanghai (CN); Wei Zhao, Shanghai (CN); Xiaoli Hu, Shanghai (CN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/175,466

(22) Filed: Jun. 7, 2016

(65) Prior Publication Data

US 2017/0352407 A1    Dec. 7, 2017

(51) Int. Cl.
G11C 11/419        (2006.01)

(52) U.S. Cl.
CPC .................................. G11C 11/419 (2013.01)

(58) Field of Classification Search
CPC .................................................... G11C 11/419
USPC ........................................................ 365/154
See application file for complete search history.

(56) References Cited

U.S. PATENT DOCUMENTS

| 5,495,191 | A  |   | 2/1996  | Lev et al. |            |
|-----------|----|---|---------|------------|------------|
| 6,172,935 | B1 | * | 1/2001  | Wright     | G11C 7/1072 |
|           |    |   |         |            | 365/194 |
| 6,297,670 | B1 |   | 10/2001 | Chan et al. |           |
| 6,442,054 | B1 | * | 8/2002  | Evans      | G11C 7/062 |
|           |    |   |         |            | 365/203 |
| 6,760,242 | B1 | * | 7/2004  | Park       | G11C 15/00 |
|           |    |   |         |            | 365/203 |
| 7,006,368 | B2 | * | 2/2006  | Arsovski   | G11C 15/04 |
|           |    |   |         |            | 365/203 |
| 7,751,218 | B2 |   | 7/2010  | Arsovski   |            |
| 2008/0025073 | A1 | * | 1/2008 | Arsovski | G11C 7/067 |
|           |    |   |         |            | 365/149 |
| 2008/0025074 | A1 | * | 1/2008 | Arsovski | G11C 7/067 |
|           |    |   |         |            | 365/149 |
| 2015/0055389 | A1 | * | 2/2015 | Arsovski | G11C 7/08 |
|           |    |   |         |            | 365/49.17 |

OTHER PUBLICATIONS

Arsovski et al., "Self-referenced sense amplifier for across-chip-variation immune sensing in high-performance Content-Addressable Memories", IEEE Custom Integrated Circuits Conference 2006, pp. 453-456.
Reniwal et al., "Robust, Ultra Fast Data Sensing Technique for Low Power Asymmetrical SRAM with Self-Shut-Off Feature", 2013 IEEE Asia Pacific Conference, pp. 77-82.
German Office Action for the related DE Application No. 10 2016 215 292.0, dated Feb. 14, 2017, 3 pages.

\* cited by examiner

*Primary Examiner* — Hoai V Ho
*Assistant Examiner* — Muna A Techane
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to sensing circuit for a memory and methods of use. The memory includes a self-referenced sense amp that is structured to calibrate its individual pre-charge based on a trip-point, with autonomous pre-charge activation circuitry that starts pre-charging a sense-line on each unique entry as soon as a sense has been performed or completed.

20 Claims, 3 Drawing Sheets

SELF PRE-CHARGING MEMORY CIRCUITS

FIELD OF THE INVENTION

The present disclosure relates to semiconductor structures and, more particularly, to a self pre-charging memory circuit and methods of use.

BACKGROUND

Single ended sensing is often used with a matchline (ML) in Content Addressable Memory (CAM) and a bitline in eight-transistor Static Random-Access Memory (8T SRAM). Sensing is performed in two non-overlapping phases (PRE-CHARGE and SENSE) each controlled by GLOBAL sensing signals. That is, matchlines or bitlines are pre-charged and then evaluated (e.g., sensed). In SRAM cells, each phase, e.g., pre-charge and sensing, has been timed to bound both 5 sigma weak PRE-CHARGE entries and 5 sigma weak SENSE entries, satisfying a very low-probability of having a single entry be both 5 sigma weak for PRE-CHARGE and 5 sigma weak for SENSE entry.

As technology scales to submicron geometries, random device variation (RDV) is becoming more prominent, with its effects especially evident in the design of semiconductor memories. That is, RDV is becoming a major bottleneck for improving performance. For example, as device variation increases, timing uncertainty for signal arrival and data capture increases, requiring larger data capture margins, and therefore limiting performance. RDV of parameters can include transistor length, transistor width and transistor threshold voltage even in identically designed neighboring devices.

By way of illustration, conventional self-referenced sense amplifiers require a globally timed signal, i.e., a clock-based signal that is applied to plural sense amplifiers, to stop the pre-charge phase and begin the evaluation phase. Using a globally timed signal causes a plurality of sense amplifiers to have the same amount of pre-charge time. However, due to process variations, some sense amplifiers may not require the full pre-charge time in order to reach their particular pre-charge level. This results in some sense amplifiers sitting idle in the pre-charge phase after they have reached their pre-charge level but before the globally timed signal turns off the pre-charge. Accordingly, large over-bounding for timing uncertainty can be caused by RDV-induced timing uncertainty, with globally timed sensing signals.

SUMMARY

In an aspect of the disclosure, a memory comprises a self-referenced sense amp that is structured to calibrate its individual pre-charge based on a trip-point, with autonomous pre-charge activation circuitry that starts pre-charging a sense-line on each unique entry as soon as a sense has been performed or completed.

In an aspect of the disclosure, a circuit comprises: an inverter having an input from a bitline and an output connecting to a first FET; a sensing node coupled to the bitline by the first FET; a pre-charge FET coupled to the sensing node with its gate connected to a sense feedback signal of a latch, where the latch couples the sensing node to a sense output; a second FET connected in parallel with the pre-charge FET; and a reset signal (RESETB) connecting to the input of the latch.

In an aspect of the disclosure, a method comprises triggering a sense output (DL) of a sense amplifier during an evaluation phase to begin a pre-charge of a bitline independent of a global pre-charge signal.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a self pre-charging memory circuit and methods of use. More specifically, the present disclosure relates to a high performance, self-pre-charging, single ended sensing circuit. Advantageously, by implementing the design described herein, performance improvements can be achieved by 2× over current multi-port sensing circuits, while also achieving lower overall power.

In embodiments, the sensing circuit uses a self-referenced and self pre-charged sensing amplifier to improve RDV-induced timing uncertainty. For example, in embodiments, the sensing circuit is designed to detect signal development on each individual memory entry without the need for a global SET signal. More specifically, the sensing circuit is designed to pull down a dataline by a single read-stack to start a local bitline (BL) pre-charge without the need for a global pre-charge signal. By starting pre-charge on fast SENSE entries, it is now possible to maximize the bitline (BL) utilization (effectively RSSing (Root Sum Square) the timing uncertainty of the PRE-CHARGE and SENSE phases).

Figure 1:
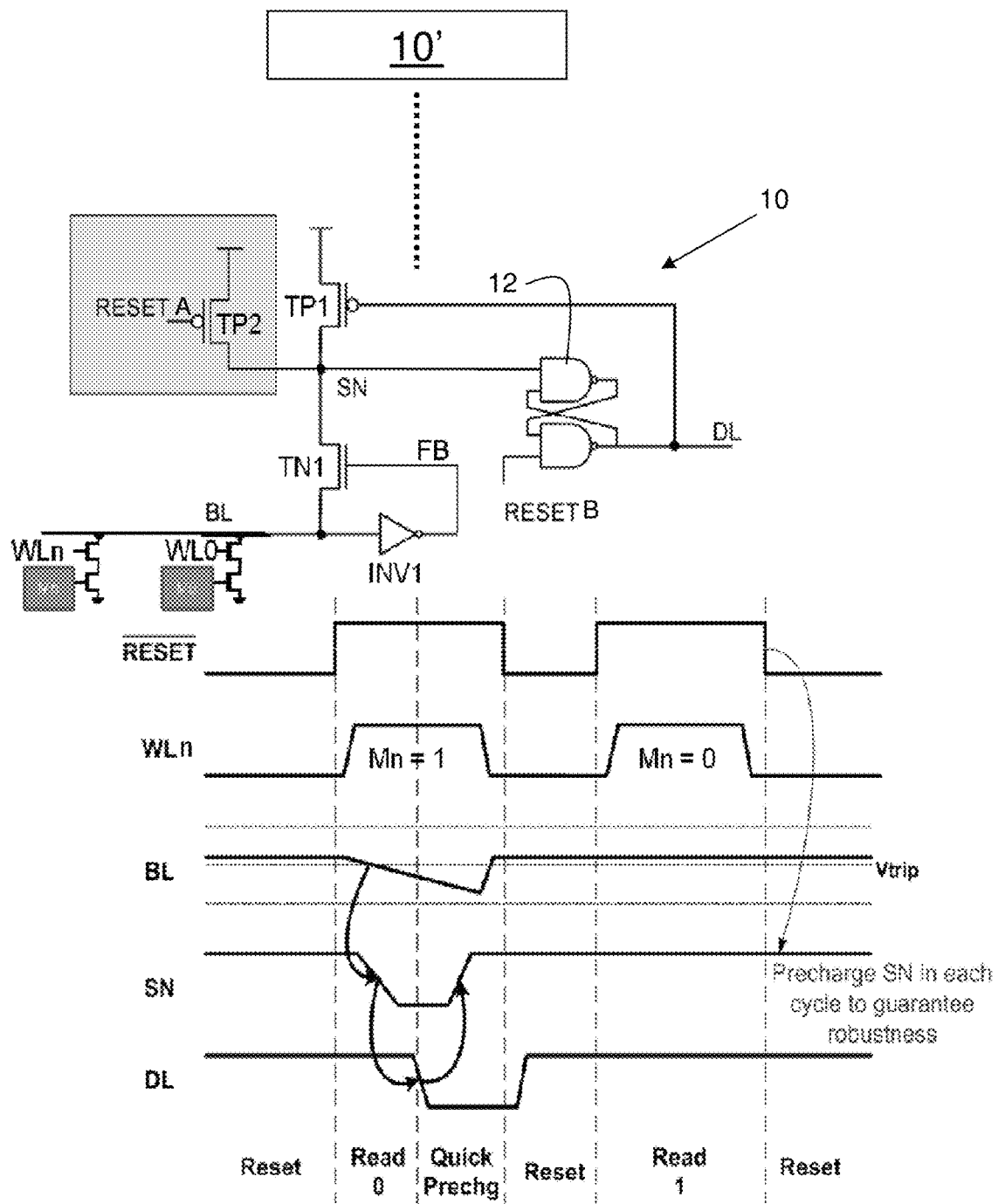
FIG. 1 shows a circuit in accordance with aspects of the present disclosure.

FIG. 1 shows a circuit in accordance with aspects of the present disclosure. More specifically, the circuit 10 is a single-ended sense amplifier which can be implemented in memory devices such as SRAM devices. It should be understood that although a single circuit 10 is shown, each memory element of the SRAM device would include the circuit 10 as represented by the dashed lines of FIG. 1 and the box labeled 10'.

In embodiments, the circuit 10 includes an inverter (INV1), whose input is the bitline (BL). In embodiments, the inverter (INV1) can be replaced with a Schmitt trigger, which allows the bitline (sense-line) pre-charge level to be higher than the sense point. The output feedback signal (FB) of the inverter (INV1) connects to a gate of an NFET (TN1). In embodiments, the NFET can be an NMOS-type device. The NFET (TN1) couples the bitline (BL) to an inverted version of a sensing node (SN). The bitline (BL) also couples to a plurality of wordlines (WLn . . . WL0). In embodiments, it should be understood by those of skill in the art that the bitline (BL) can be a sense-line, which applies to any sensing on a capacitive sense-line.

Still referring to FIG. 1, a pre-charge PFET (TP1) is coupled to the sensing node (SN), and its gate is connected to a sense output (DL) of an SR-latch 12. In embodiments, the SR-latch 12 can be cross coupled NAND gates and the PFET can be a PMOS-type device. The SR-latch 12 is used to couple the sensing node (SN) to a dataline, e.g., sense output (DL). A reset signal (RESETB) connects to the input of the SR-latch 12. A weak pre-charge PFET (TP2) is parallel connected with pre-charge PFET (TP1). The weak pre-charge PFET (TP2) is connected to a global reset signal (RESETA).

Accordingly, the circuit 10 of FIG. 1 comprises a self-reference sensing scheme (e.g., TP1, TN1 and INV1) that detects signal development on each individual memory entry and can control the pre-charge duration and sense duration without the need for a global SET signal. Advantageously, the self-reference sensing scheme can calibrate its individual pre-charge based on its trip-point, to improve sense-time. Moreover, the self-reference sensing scheme has autonomous pre-charge activation that starts pre-charging each unique entry as soon as the correct sense has been detected, getting it ready for the next read cycle even before other entries of other cells have completed their sensing. The global-signal can reinforce the pre-charge once all entries have completed sense.

More specifically and by way of an illustrative example, the beginning phase of the bitline (BL) pre-charge can be triggered by the sense output (DL). Once the evaluation phase is completed, the pre-charge phase can begin, with pre-charge timing being independent on each bitline (BL) (i.e., it no longer needs to wait for a global pre-charge signal). For example, the self-pre-charge path (i.e., TP1 and RS-trigger) could at the very worst case pull down the sense output (DL) to start a local bitline (BL) pre-charge before all of the entries have finished their own SENSE phase. Therefore, this scheme improves performance and saves power for memory cells.

In a more specific non-limiting operational example, when RESETB goes from high to low, PFET (TP2) is open and sensing node (SN) is pre-charged to high. The same RESETB signal resets the output of the latch (DL). If the bitline voltage level is lower than the threshold voltage of the inverter (INV1), the feedback signal (FB) goes high and turns on NFET (TN1) and bitline (BL) will be pulled up towards the higher power supply e.g. Vdd, by the sensing node (SN). And, as soon as bitline voltage exceeds the threshold voltage of the inverter (INV1), the feedback signal (FB) will go low and will turn off NFET (TN1). In this way, bitline (BL) can be charged at a level slightly higher than the threshold of inverter (INV1).

During the evaluation phase, RESETB goes from low to high. If the bitline (BL) starts to discharge, it will quickly turn over the inverter (INV1) and cause the feedback signal (FB) to go high. NFET (TN1) will then open and the sense node (SN) is pulled down to a voltage level, same as the bitline (BL). Once the sense node (SN) level is below the trigger point of the SR-latch 12, the sense output (DL) corresponds to low. The NFET (TP1) is then open and starts to pre-charge the sense node (SN) as well as bitline (BL). If the bitline (BL) does not discharge, the sense node (SN) and sense output (DL) keep high.

Moreover, in embodiments, the global reset signal (RESETA) can be used to pre-charge the bitline (BL) of each memory cell, prior to turning on any of the plurality of wordlines (WLn . . . WL0). For example, the sense node (SN) of each memory cell can be charged by the global reset signal (RESETA), pulling the bitline (BL) high. In this operational phase, both the NFET (TN1) and PFET (TP2) would be high (open).

Accordingly, it should now be understood by those of skill in the art that the circuit 10 uses a self-controlled signal to stop sensing and start the pre-charge at an end of a read cycle when the bitline signal margin is sufficient. This improves the clock to clock cycle time, and saves power on pre-charging the bitlines. This scheme can also self-calibrate to pre-charge the bitline to VDD/2 instead of an extra power supply. This results in less requirement for the chip and improves the immunity to across chip variation.

Figure 2:
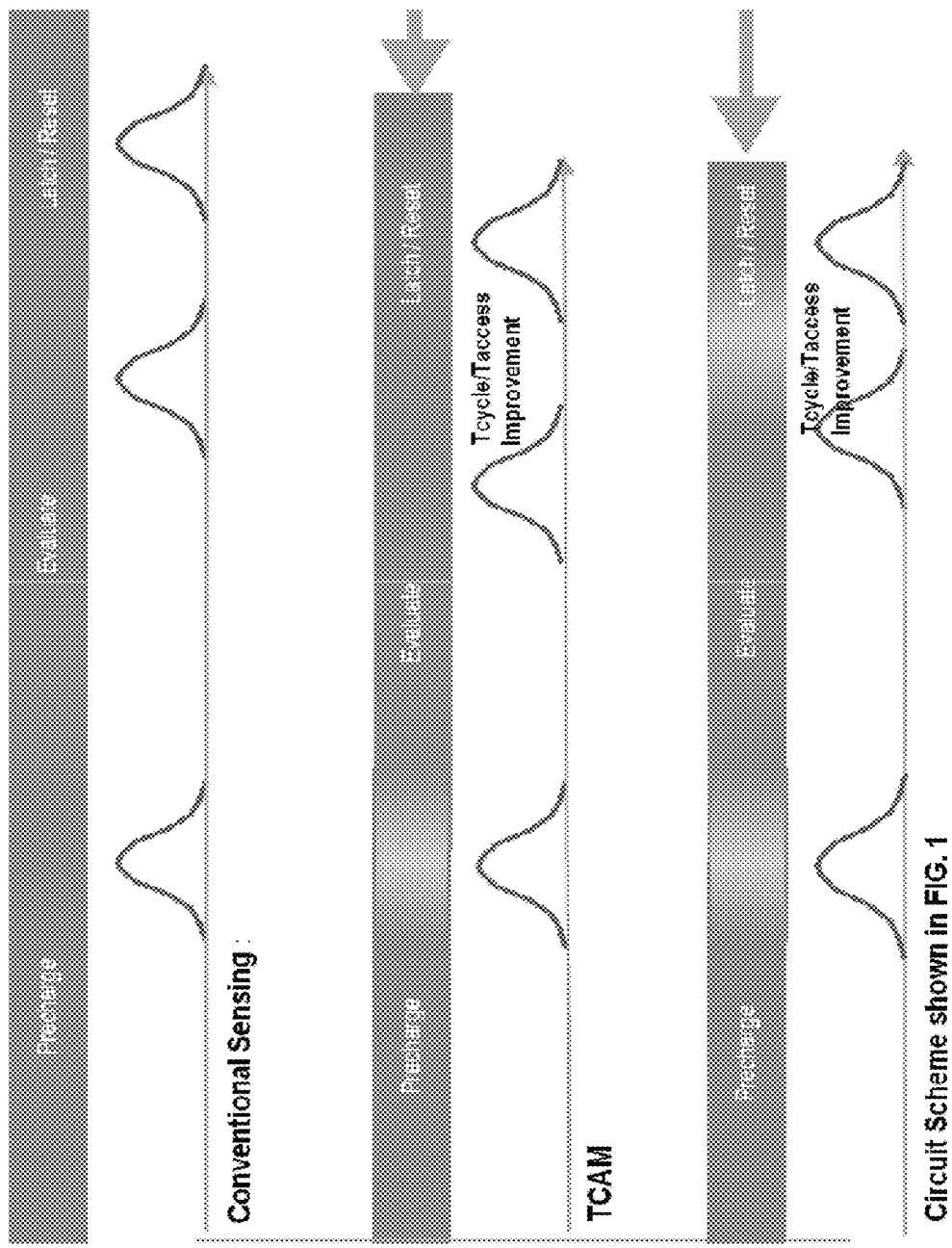
FIG. 2 shows a comparison graph of pre-charging schemes.

FIG. 2 shows a comparison graph of pre-charging schemes. In particular, FIG. 2 shows a comparison between a conventional sensing scheme, a TCAM implementation and the circuit scheme of FIG. 1. As representatively shown in FIG. 2, the circuit scheme of FIG. 1 provides the fastest cycle times.

As shown in FIG. 2, in the conventional sensing scheme, a global signal is used to time and capture both 5 sigma pre-charge and 5 sigma evaluation entries: Tcycle=mean_pre+mean_eval+mean_reset+5*sigma_pre+ 5*sigma_eval+5*sigma_reset. In this scheme, though, the global signal must wait for completion of the slowest pre-charge, evaluate and latch/reset phases to provide the global signal. As should be understood, the pre-charge, evaluate and latch reset of each cell can be different due to the RDV, i.e., metal variation which needs to be accounted through a global pre-charge signal, and with self-referenced sensing near-to-far sense-line pre-charge voltage timing being problematic.

In the TCAM implementation, local pre-charge shut-off allows entries with better than 5-sigma_pre-charge to start evaluating early, effectively RSSing pre-charge and evaluation, i.e., Tcycle=mean_pre+mean_eval+mean_reset+ 5*RSS(sigma_pre, sigma_eval)+5*sigma_reset. In this scheme, the global signal can be triggered, with local control for each phase. Importantly, though, and in comparison to the conventional sensing scheme and the TCAM implementation, by implementing the circuit scheme of FIG. 1, local pre-charge shut-off allows entries better than TCAM to not only start evaluating early but also start resetting early, effectively RSSing pre-charge, evaluation and reset, i.e., Tcycle=mean_pre+mean_eval+mean_reset+5*RSS(sigma_pre, sigma_eval, sigma_reset).

Figure 3:
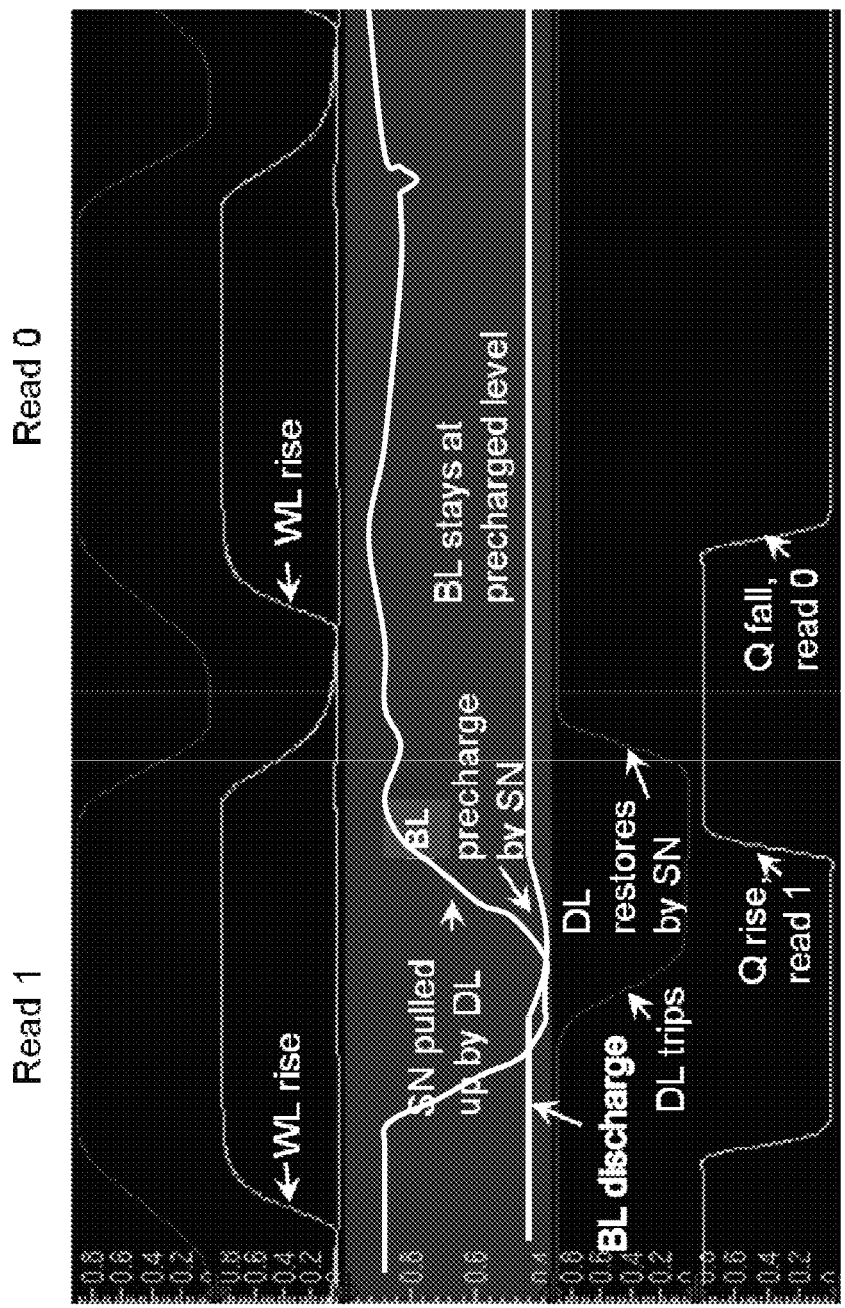
FIG. 3 shows a simulation waveform of the circuit of FIG. 1, in accordance with aspects of the present disclosure.

FIG. 3 shows a simulation waveform of the circuit of FIG. 1, in accordance with aspects of the present disclosure. As shown in FIG. 3, during Read 1 cycle, output Q is triggered by data read out from the sense amplifier. During Read 0 cycle, output Q is reset by a reset timing signal. And, as further shown, at bitline (BL) discharges, the output (DL) will trip and sense node (SN) will be pulled up. The discharge of the bitline (BL) will result in a very slight dip of its charge, e.g., still near the threshold value of the inverter (INV1). Due to this very slight dip, the bitline (BL) can be easily and quickly returned to its pre-charged state, e.g., Vdd, by sense node (SN).

The sensing circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the sensing circuit of the present disclosure have been adopted from integrated circuit (IC) technology. For example, the structures are built on wafers and are realized in films of material patterned by photolithographic processes on the top of a wafer. In particular, the fabrication of the sensing circuit uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory comprising a self-referenced sense amp that is structured to calibrate its individual pre-charge based on a trip-point, with autonomous pre-charge activation circuitry that starts pre-charging a sense-line on each unique entry as soon as a sense has been performed or completed, wherein the autonomous pre-charge activation circuitry comprises:
   a pre-charge PFET directly coupled to a sensing node and its gate directly connected to a sense feedback signal of a latch;
   the latch directly couples the sensing node to a sense output; and
   a second pre-charge PFET is parallel and is directly connected with the pre-charge PFET.

2. The memory of claim 1, further comprising a global-signal that reinforces the pre-charge once all entries have completed a sense operation.

3. The memory of claim 1, wherein the autonomous pre-charge activation circuitry pre-charges the sense-line for a next read cycle prior to other entries of other memories in an array of memories completing their sensing.

4. The memory of claim 1, wherein the autonomous pre-charge activation circuitry comprises a first transistor in series with the pre-charge PFET and an inverter that detects signal development on each individual memory entry and controls pre-charge duration and sense duration without need for a global precharge signal.

5. The memory of claim 1, wherein a beginning phase of the sense-line pre-charge is triggered by a sense output and is independent of a global pre-charge signal.

6. The memory of claim 1, wherein the autonomous pre-charge activation circuitry further comprises:
   an inverter whose input is the sense-line and whose output connects to a gate of an NFET; and
   the NFET couples the sense-line to an inverted version of the sensing node.

7. The memory of claim 6, wherein the second pre-charge PFET is connected to a global reset signal (RESETA).

8. The memory of claim 7, further comprising a reset signal (RESETB) connecting to the input of the latch, wherein when the reset signal (RESETB) is resetting the latch, the global reset signal (RESETA) reinforces the pre-charge though the second pre-charge PFET in case self-initiated precharge did not full precharge the sense-line.

9. The memory of claim 8, wherein the latch comprises cross coupled NAND gates.

10. The memory of claim 8, wherein when a sense-line voltage level is lower than a threshold voltage of the inverter, the sense feedback signal goes high and turns on the NFET and the sense-line will be pulled up by the sensing node.

11. The memory of claim 10, wherein as soon as the sense-line voltage level exceeds the threshold voltage of the inverter, the sense feedback signal will go low and will turn off the NFET.

12. The memory of claim 11, wherein when the reset signal (RESETB) goes from low to high, and when the sense-line starts to discharge, the sense-line will turn over the inverter and cause the sense feedback signal to go high at which time the NFET will open and the sense node is pulled down to a voltage level same as the sense-line.

13. The memory of claim 12, wherein once a sense amplifier has completed its sense and starts to precharge the sense-line back up to get it ready for a next operation by the pre-charge PFET turning on and starting to pre-charge the sense node as well as the sense-line.

14. The memory of claim 13, wherein after sensing is completed, a delay element is added before start of the autonomous pre-charge.

15. A circuit, comprising:
   an inverter having an input from a bitline and an output connecting to a first FET;
   a sensing node coupled to the bitline by the first FET;
   a pre-charge FET directly coupled to the sensing node with its gate directly connected to a sense feedback signal of a latch;
   the latch directly couples the sensing node to a sense output;
   a second FET directly connected in parallel with the pre-charge FET; and
   a reset signal (RESETB) directly connecting to the input of the latch.

16. The circuit of claim 15, wherein the second FET is connected to a global reset signal (RESETA).

17. The circuit of claim 16, wherein when the reset signal (RESETB) goes from high to low, the output of the latch corresponds to the high.

18. The circuit of claim 17, wherein:
   when a bitline voltage level is lower than a threshold voltage of the inverter, the sense feedback signal goes high and turns on the first FET and the bitline will be pulled up by the sensing node; and
   when the bitline voltage level exceeds the threshold voltage of the inverter, the sense feedback signal will go low and will turn off the first FET.

19. The circuit of claim 18, wherein when the reset signal (RESETB) goes from low to high, and when the bitline starts to discharge, the bitline will turn over the inverter and cause the sense feedback signal to go high at which time the first FET will open and the sense node is pulled down to a voltage level same as the bitline.

20. A method, comprising triggering a sense output (DL) of a sense amplifier during an evaluation phase to begin a pre-charge of a bitline independent of a global pre-charge signal, wherein the pre-charge of the bitline is provided by a feedback signal of an inverter going high and turning on a FET within a path of the bitline (BL) and a sense node providing a charge through the FET to the bitline (BL), with a pre-charge PFET directly coupled to a sensing node receiving a sense feedback signal of a latch which is also directly coupled to the sensing node to provide sense output to the latch.

* * * * *